(12) United States Patent
Edwards

(10) Patent No.: US 7,952,343 B2
(45) Date of Patent: May 31, 2011

(54) CURRENT MEASUREMENT CIRCUIT AND METHOD

(75) Inventor: Martin J. Edwards, Crawley (GB)

(73) Assignee: Chimei Innolux Corporation, Miao-Li County (TW)

( * ) Notice: Subject to any disclaimer, the term of this patent is extended or adjusted under 35 U.S.C. 154(b) by 359 days.

(21) Appl. No.: 12/097,433

(22) PCT Filed: Nov. 14, 2006

(86) PCT No.: PCT/IB2006/054233
§ 371 (c)(1),
(2), (4) Date: Jun. 13, 2008

(87) PCT Pub. No.: WO2007/069102
PCT Pub. Date: Jun. 21, 2007

(65) Prior Publication Data
US 2008/0303507 A1 Dec. 11, 2008

(30) Foreign Application Priority Data
Dec. 15, 2005 (EP) .................................. 05112229

(51) Int. Cl.
G01R 19/00 (2006.01)
G01R 27/02 (2006.01)
G01R 27/26 (2006.01)
(52) U.S. Cl. .................. 324/76.11; 324/606; 324/607; 324/678; 702/64
(58) Field of Classification Search ........... 324/76.11, 324/602, 605–607, 676, 678; 702/64
See application file for complete search history.

(56) References Cited

U.S. PATENT DOCUMENTS

| 3,976,942 | A | * | 8/1976 | Mayfield | 324/142 |
| 4,112,428 | A | * | 9/1978 | Dorsman | 324/99 D |
| 5,083,091 | A | * | 1/1992 | Frick et al. | 324/678 |
| 5,936,433 | A | * | 8/1999 | Holloway | 327/75 |
| 6,750,796 | B1 | * | 6/2004 | Holloway et al. | 341/143 |
| 6,791,405 | B2 | * | 9/2004 | Tsuji et al. | 330/10 |
| 6,903,558 | B1 | * | 6/2005 | Blom et al. | 324/712 |
| 6,930,495 | B1 | * | 8/2005 | Blom et al. | 324/712 |

FOREIGN PATENT DOCUMENTS
JP 2004-333208 11/2004
* cited by examiner

Primary Examiner — Timothy J Dole
(74) Attorney, Agent, or Firm — Fish & Richardson P.C.

(57) ABSTRACT

Apparatus (1) and corresponding method for measuring a current (10) in which a charge integrating circuit (2) integrates charge from the current to be measured (10) and applies a resulting change in voltage to a comparator circuit (4) that compares the input voltage (12) with a threshold voltage level (Vthreshoid) and provides an output (14) responsive thereto to a logic circuit (6) that generates a feedback signal (16) dependent upon the comparator output (14) and provides the feedback signal (16) to the charge integrating circuit (2) that integrates charge from the received feedback signal (16) in opposition to the integrating of the charge from the current to be measured (10). The logic circuit (6) generates an output signal (18), based upon the comparator circuit output (14) and dependent upon the level of the current to be measured (10), for example a pulse (50) of a width (TOUT) dependent upon the level of the current (10). A converter circuit (8) may convert the output signal (18) to digital output data (20).

17 Claims, 6 Drawing Sheets

CURRENT MEASUREMENT CIRCUIT AND METHOD

The present invention relates to a current measurement circuit and method. The present invention is particularly suited to, but not limited to, use in thin film applications such as active matrix displays.

Circuits for current measuring are required in many applications. In many such applications, precise electronic components are available for use, enabling the function of the current measurement circuits to rely upon such precision.

For example, JP2001-324519 discloses a current measuring circuit including a current source, a capacitor circuit and a comparator. The output signal depends on the threshold voltage of the offset voltage of the comparator, and therefore accuracy of the measurement circuit relies upon the precision or definition of these characteristics.

The present inventor has realized that in other applications, electronic components available for use in a current measurement circuit are less precise or less well defined. For example, in active matrix displays, thin film transistors deposited on a display substrate often do not have well defined characteristics. The present inventor has further realized it would be desirable to provide a current measurement circuit and method which accommodate less precise or less well defined electronic components.

In a first aspect, the present invention provides apparatus for measuring a current, comprising: a charge integrating circuit; a comparator circuit; and a logic circuit; wherein the charge integrating circuit is arranged to integrate charge from the current to be measured and apply a resulting change in voltage as an input to the comparator circuit; the comparator circuit is arranged to compare the input voltage with a threshold voltage level and provide an output responsive thereto to the logic circuit; the logic circuit is arranged to generate a feedback signal dependent upon the comparator output and to provide the feedback signal to the charge integrating circuit; the charge integrating circuit is further arranged to integrate charge from the received feedback signal in opposition to the integrating of the charge from the current to be measured; and the logic circuit is further arranged to generate an output signal based upon the output from the comparator circuit and dependent upon the level of the current to be measured.

The output signal generated by the logic circuit may comprise a pulse of a width dependent upon the level of the current to be measured.

The apparatus may further comprise a converter circuit arranged to convert the output signal to digital output data.

The comparator circuit may comprise an inverter, the threshold voltage level being the switching threshold voltage of the inverter.

The charge integrating circuit may comprise a transistor arranged to isolate the input of the comparator circuit from the current to be measured input of the charge integrating circuit.

In a further aspect, the present invention provides an active matrix device comprising one or more apparatus according to any of the above mentioned aspects and wherein the circuits of the one or more apparatus comprise thin film components formed on a substrate of the active matrix device.

In a further aspect, the present invention provides a method for measuring a current, comprising: a charge integrating circuit integrating charge from the current to be measured and apply a resulting change in voltage as an input to a comparator circuit; the comparator circuit comparing the input voltage with a threshold voltage level and providing an output responsive thereto to a logic circuit; the logic circuit generating a feedback signal dependent upon the comparator output and providing the feedback signal to the charge integrating circuit; the charge integrating circuit integrating charge from the received feedback signal in opposition to the integrating of the charge from the current to be measured; and the logic circuit generating an output signal based upon the output from the comparator circuit and dependent upon the level of the current to be measured.

The output signal generated by the logic circuit may comprise a pulse of a width dependent upon the level of the current to be measured.

The method may further comprise a converter circuit converting the output signal to digital output data.

The comparator circuit may comprise an inverter, the threshold voltage level being the switching threshold voltage of the inverter.

The charge integrating circuit may comprise a transistor arranged to isolate the input of the comparator circuit from the current to be measured input of the charge integrating circuit.

An arrangement and method are provided in which the current to be measured is applied to an arrangement of capacitors. The current flow causes the voltage on the capacitors to change over time with the rate of change depending on the capacitance values and the current value. The changing voltage is applied to the input of a comparator circuit. The comparator compares the voltage on the capacitor arrangement with some reference level, the value of this reference level will depend on the circuit used for the comparator. The output of the comparator circuit is applied to a logic circuit which generates an output signal which represents the measured current and a feedback signal which is applied to the capacitor arrangement.

Embodiments of the present invention will now be described, by way of example, with reference to the accompanying drawings, in which.

The embodiments described below use components provided by thin film techniques on a substrate of an active matrix display device. Nevertheless, it is to be appreciated that in other embodiments the same or corresponding current measurement circuit (and corresponding method of current measurement) may be provided as apart of other types of devices, or as a stand-alone current measurement circuit. Moreover, this may be implemented using types of electronic components other than thin film devices deposited on a substrate.

Figure 1:
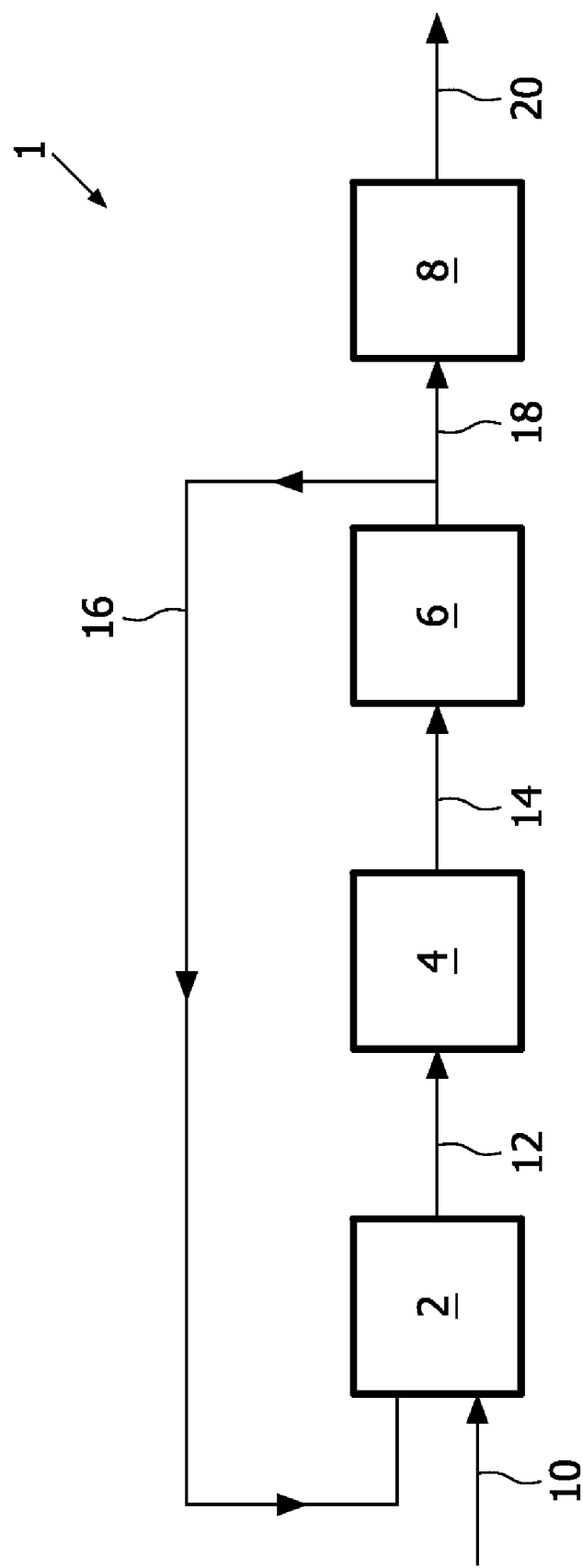
FIG. 1 is a block diagram of a current measurement circuit according to an embodiment of the present invention.

FIG. 1 is a block diagram of a current measurement circuit 1 according to a first embodiment. In this embodiment the current measurement circuit 1 is implemented using thin film components fabricated on a substrate along with other active matrix display device components, and thereby forms part of an active matrix display. The current measurement circuit 1 comprises a capacitor circuit 2, a comparator circuit 4, a logic circuit 6 and a counter circuit 8. A first input of the capacitor circuit 2 is provided for inputting the current to be measured 10 therein. An output of the capacitor circuit 2 is coupled to an input of the comparator circuit 4. An output of the comparator circuit 4 is coupled to an input of the logic circuit 6. A first output of the logic circuit 6 is coupled to a second input of the capacitor circuit 2. A second output of the logic circuit 6 is coupled to an input of the counter circuit 8. An output of the counter circuit 8 is provided for outputting output data 20 representing the measured current level.

In overview, during operation of the current measurement circuit, the following signals and voltages are applied or flow between the above described parts of the current measurement system 1. The current to be measured 10 is input to the capacitor circuit 2. A comparator input voltage is applied from the capacitor circuit 2 to the comparator circuit 4. A comparator output voltage 14 is applied from the comparator circuit 4 to the logic circuit 6. A feedback signal 16 is applied from the logic circuit 6 to the capacitor circuit 2. An output signal 18 is applied from the logic circuit 6 to the counter circuit 8. Output data 20 representing the measured current level is output from the counter circuit 8.

In overview, operation of the current measurement circuit 1 is as follows. The output signal 18 output by the logic circuit 6 includes a digital pulse having a duration which is proportional to the current value of the current to be measured 10. The current to be measured 10 is integrated by the capacitor circuit 2 and the resulting change in voltage is applied as the comparator input voltage 12 to the input of the comparator circuit 4. The comparator output voltage 14 is applied to the logic circuit 6, which provides the feedback signal 16 which is fed back to the capacitor circuit 2 in a way that produces a known change in the comparator input voltage 12 voltage at the input of the comparator circuit 4 which opposes the change caused by the current to be measured 10. The time required for the current be measured 10 to cancel this known change in voltage is represented as a pulse in the output signal 18 which is input to the counter circuit 8. The duration of the pulse represents the current value of the current to be measured 10. The counter circuit 8 converts the output pulse of the circuit into digital output data 20, e.g. a digital number representing the current level.

The duration of the output pulse depends on the current value of the current to be measured 10 and the values of capacitors within the current measurement circuit 1. It does not depend strongly on the characteristics of the comparator circuit 4, hence the current measurement circuit 10 is particularly advantageous when fabricated using thin film transistors which do not have well defined characteristics.

The operation of the current measurement circuit 1 will now be described in more detail with reference to FIGS. 2 and 3.

Figure 2:
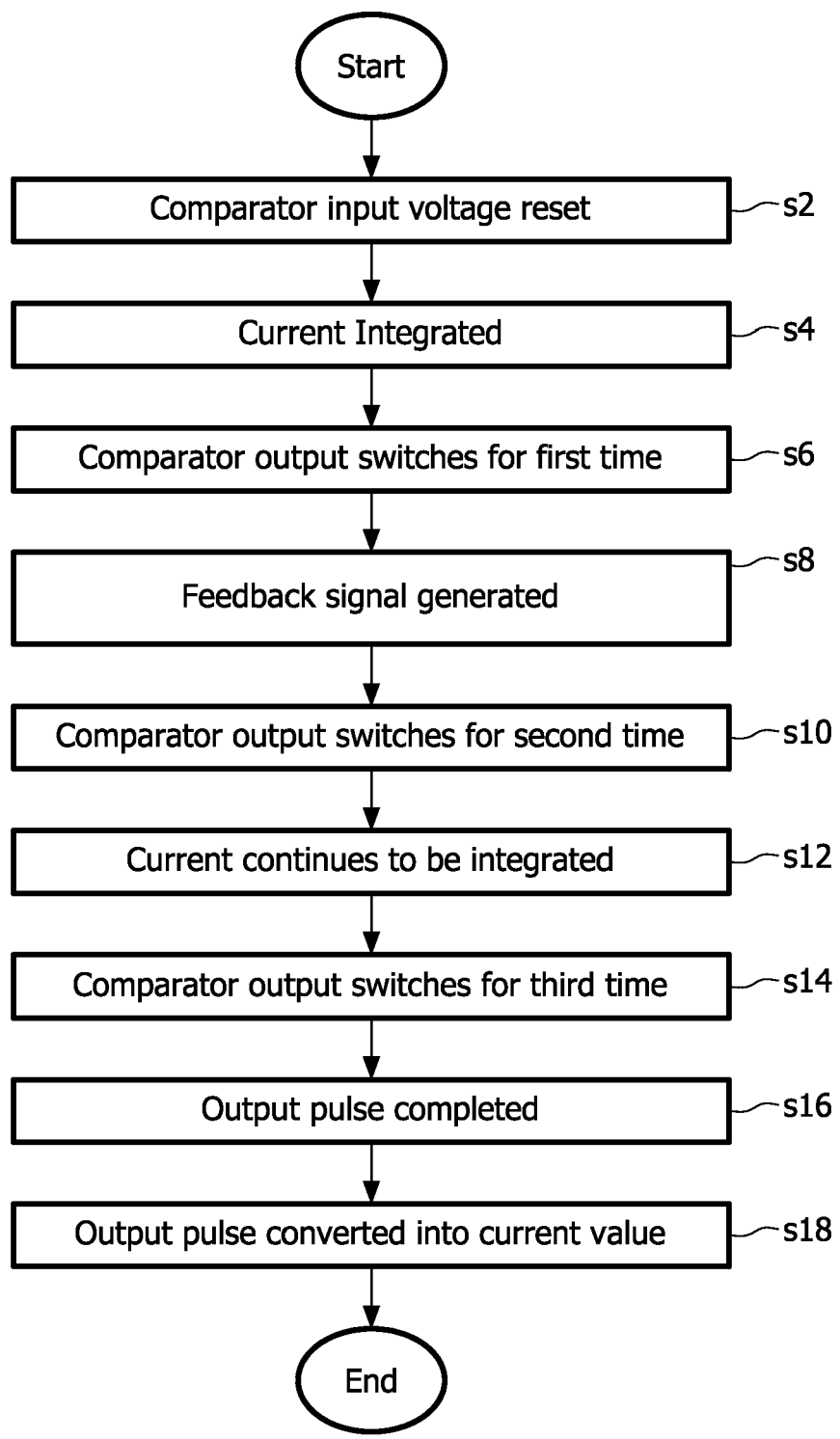
FIG. 2 is a flowchart showing process steps carried out during operation of the current measurement circuit of FIG. 1.

FIG. 2 is a flowchart showing process steps carried out during operation of the current measurement circuit 1. For ease of explanation, the process steps are shown and described as sequential steps; however it will be appreciated that in practice some of the steps may overlap or otherwise occur simultaneously.

Figure 3:
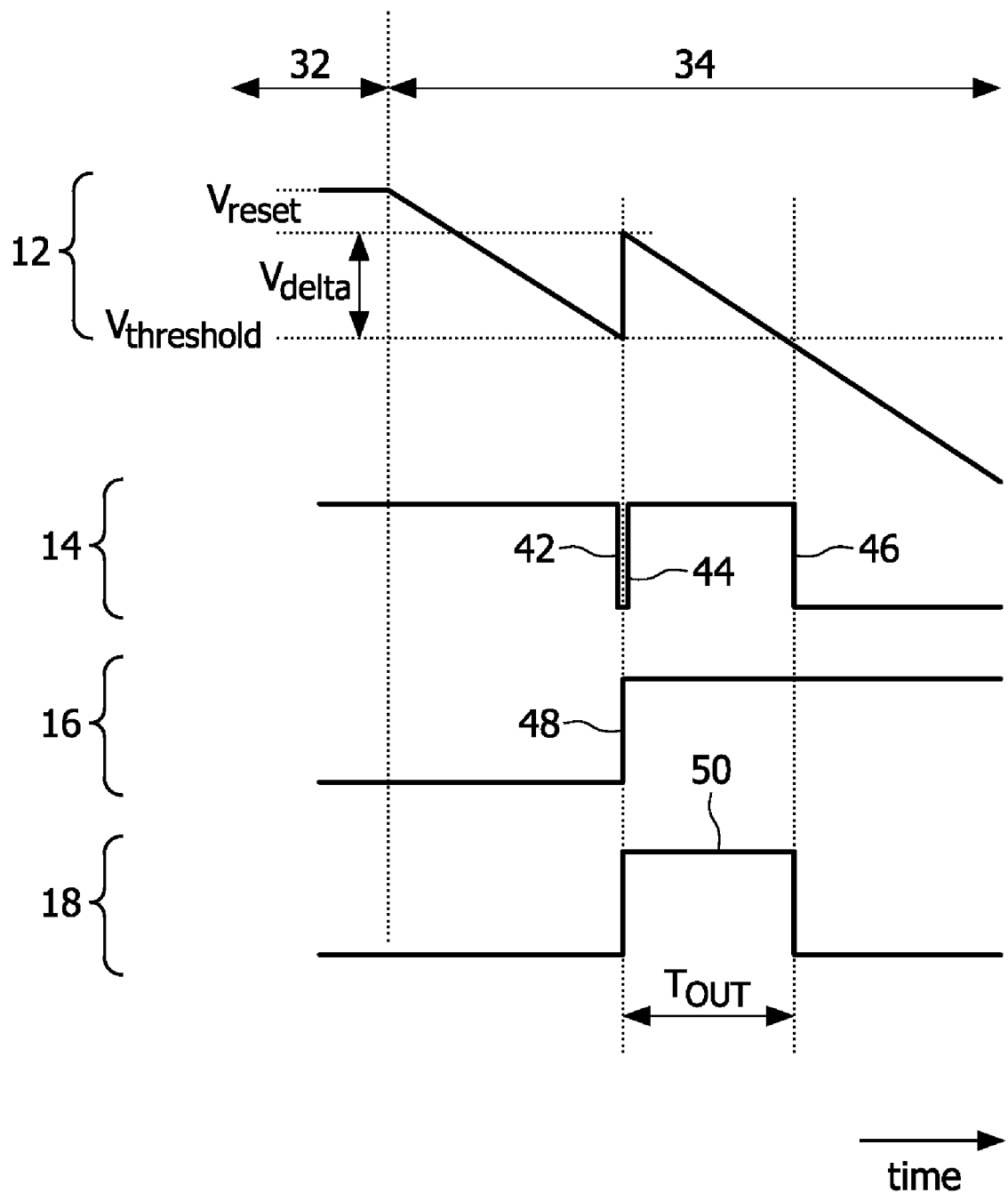
FIG. 3 is a schematic illustration, not to scale, of waveforms employed in or resulting from operation of the current measurement circuit of FIG. 1.

FIG. 3 is a schematic illustration, not to scale, of waveforms employed in or resulting from operation of the current measurement circuit 1 in this embodiment. The waveforms shown in FIG. 3 (and also described earlier with respect to FIG. 1) against time are as follows: the comparator input voltage 12; the comparator output voltage 14; the feedback signal 16; and the output signal 18. Also indicated in FIG. 3 are a reset time stage 32 and an input current integrating time stage 34. Various voltage levels are indicated on the waveform of the comparator input voltage 12, namely a reset voltage $V_{reset}$, a voltage difference $V_{delta}$, and a switching threshold voltage $V_{threshold}$. Indicated on the waveform of the comparator output voltage 14 are a first switching 42 of the comparator output, a second switching 44 of the comparator output, and a third switching 46 of the comparator output. Indicated on the waveform of the feedback signal is the switching on of the feedback signal, indicated by reference numeral 48. Indicated on the waveform of the output signal 18 is an output pulse 50 of duration $T_{OUT}$.

At the start of a measurement, at step s2 the comparator input voltage 12 is reset to the reset voltage $V_{reset}$. In this embodiment, the current to be measured is negative, hence the reset voltage $V_{reset}$ is more positive than the switching threshold voltage $V_{threshold}$ of the comparator.

At step s4 the input current to be measured 10 is integrated by the capacitor circuit 2, and consequently the comparator input voltage 12 falls. When, at step s6, the comparator input voltage 12 reaches the threshold voltage level $V_{threshold}$, the comparator output voltage 14 switches for a first time, as indicated by the first switching 42 of the comparator output voltage in FIG. 3.

This change is applied to the logic circuit 6 which in response thereto, at step s8, switches, as indicated by reference numeral 48 in FIG. 3, the feedback signal 16 applied to the capacitor circuit 2 from a low level to a high level (for this example in which the current to be measured 10 is a negative current).

The change in the level of the feedback signal 16 causes the comparator input voltage 12 to rise by a known amount, namely the voltage difference $V_{delta}$ indicated in FIG. 3. This takes the comparator input voltage 12 above the threshold voltage level $V_{threshold}$ once again, and at step s10 the comparator output voltage 14 switches for a second time, as indicated by the second switching 44 of the comparator output voltage 14 in FIG. 3.

At step s12 the comparator input voltage 12 continues to fall as the input current to be measured 10 continues to be integrated.

This continues until the comparator input voltage 12 again reaches the switching threshold value. At this point, at step s14, the comparator output voltage 14 switches for a third time, as indicated by the third switching 46 of the comparator output voltage 14 in FIG. 3.

At step s16, generation of the output pulse 50 by the logic circuit 6 from the comparator output voltage 14 is completed. In this embodiment, the output pulse 50 is generated from the timing of the switching of the comparator by taking the time between the second switching 44 and the third switching 46 of the comparator output voltage 14, to give an output pulse width (i.e. duration) TOUT as shown in FIG. 3.

This output pulse 50 is of a width (i.e. a duration) $T_{OUT}$ that is determined by the time taken for the input current to be measured 10 to change the comparator input voltage 12 by the amount of the voltage difference $V_{delta}$, and this is proportional to the input current to be measured 10.

At step s18, the counter circuit 8 converts the output pulse 50, more particularly the output pulse width or duration $T_{OUT}$, into a corresponding digital current value representative or indicative of the current level of the input current to be measured 10 and outputs this as digital output data 20.

Figure 4:
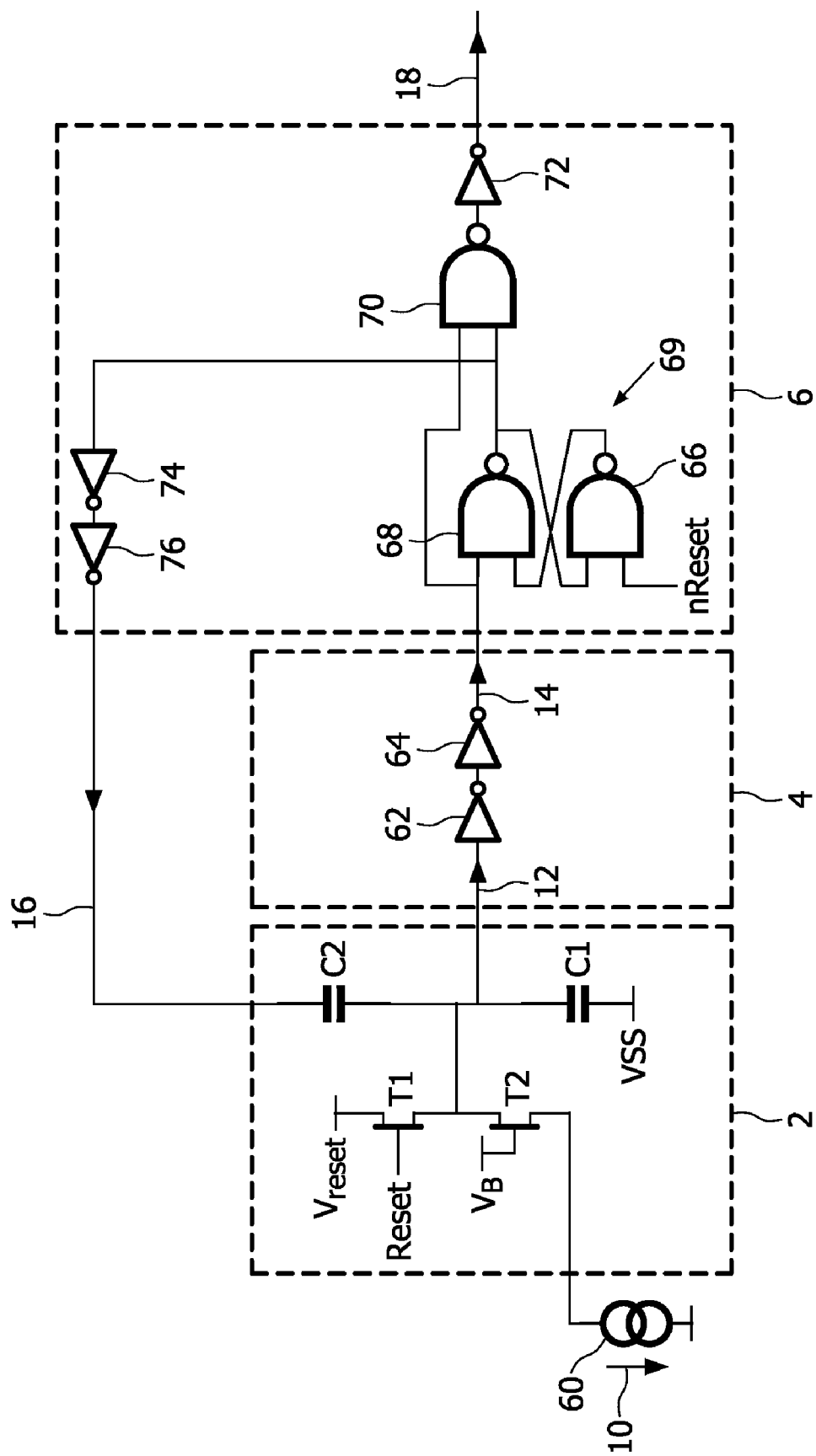
FIG. 4 is a circuit diagram showing details of certain elements of the current measurement circuit of FIG. 1.

FIG. 4 is a circuit diagram showing details of the capacitor circuit 2, the comparator circuit 4 and the logic circuit 6. Also shown in FIG. 4 is a current source 60 providing the current to be measured 10. In this embodiment the current source 60 is photo diode 60.

The capacitor circuit 2 comprises two capacitors, hereinafter referred to as C1 and C2; and two transistors, hereinafter referred to as T1 and T2. Capacitor C1 is connected between the input of the comparator circuit 4 and ground. Capacitor C2 is connected between the input of the comparator circuit 4 and the input of the capacitor circuit 2 which is coupled to an output of the logic circuit 6 and which receives therefrom the feedback signal 16. The relative value of capacitors C1 and C2 determines the magnitude of the previously described voltage difference $V_{delta}$.

Transistor T1 is provided to allow the comparator input voltage 12 to be set to the previously described reset voltage level $V_{reset}$ (at previously described step s2) and this includes a signal "reset" at the gate of the transistor T1. The current to be measured 10 is applied to the capacitance at the input node of the comparator circuit 4 via the transistor T2.

Transistor T2 isolates the input node of the comparator circuit 4 from the input of the current to be measured 10. Transistor T2 defines the voltage at the measurement input a prevents this voltage from changing significantly as the comparator input voltage 12 changes. Transistor T2 can be thought of as operating in a similar manner to a so-called cascode device, isolating the change in voltage at the input of the comparator 4 from the current input node of the circuit. However, transistor T2 is not essential, and hence in other embodiments the capacitor circuit 2 is provided without transistor T2.

The voltage at the current input of the capacitor circuit is equal to the gate voltage $V_B$ of transistor T2 minus the gate source voltage of T2. This voltage will have a relatively small dependence on the input current value and the voltage at the input of the comparator circuit 4.

In this embodiment the comparator circuit 4 is a relatively simple circuit consisting of two CMOS inverters 62 and 64 connected in series. The reference voltage of this circuit is the switching threshold voltage of the first inverter 62. This is approximately half way between the two power supply levels of the inverters, VDD and VSS, but depends on the transistor characteristics and is therefore not well defined. Advantageously, this uncertainty in the value of the reference voltage does not affect the operation of the circuit. The logic circuit 6 of this embodiment comprises three NAND gates 66, 68 and 70, and three CMOS inverters 72, 74 and 76. The two NAND gates 66 and 68 together form an SR flip flop 69. The third NAND gate 70 is used in the generation of the previously described output pulse of 50 of the output signal 18.

At the start of a measurement the state of the flip flop 69 is reset by a signal "nReset" at NAND gate 66 (as shown in FIG. 4) going low. The signal "nReset" is the inverse of the signal "Reset". This reset of the signal "nReset" at NAND gate 66 occurs at the same time as the comparator input voltage 12 is set to the reset level $V_{reset}$, which causes the comparator output voltage 14 to go to a high voltage level. When the flip flop 69 is reset the feedback signal 16 is set to a low voltage level. As the signal "Reset" returns to a low level and "nReset" returns to a high level, the comparator input voltage 12 starts to fall as the current to be measured 10 discharges capacitors C1 and C2. When the comparator input voltage 12 reaches the switching voltage of the comparator (i.e. $V_{threshold}$), the comparator output voltage 14 changes from a high level to a low level. This sets the flip flop 69 causing the feedback signal 16 to go high. When the feedback signal 16 (which is being fed back to the capacitor C2) goes from low to high the comparator input voltage 12 increases by an amount (VDD−VSS)(C2/(C2+C1)) which causes the comparator output voltage 14 to switch for a second time and to return to a high level. The state of the flip flop 69 is not affected by this second change in the comparator output voltage 14 and therefore the feedback signal 16 remains at a high level.

At the start of the measurement the output signal 18 is low. The output signal 18 goes high when both the feedback signal 16 and the comparator output voltage 14 are high, which occurs when the comparator circuit 14 switches for the second time and it's output goes from low to high. This represents the start of output pulse 50. The output signal 18 goes low again (i.e. the output pulse 50 is terminated) when the comparator output voltage 14 switches for the third time. The width $T_{OUT}$ of the output pulse 50 therefore represents the time taken for the current being measured 10 to discharge the parallel combination of capacitors C1 and C2 through a voltage (VDD−VSS)(C2/(C2+C1)).

Current value $I=CV/T=(VDD-VSS)C2/T_{OUT}$ where $T_{OUT}$ is the width of the output pulse 50.

The above operation is further enhanced by the use of the three CMOS inverters 72, 74 and 76, whose operation will now be described.

Inverter 72 is positioned in series at the output of the NAND gate 70. The inverter 72 serves to buffer the output signal 18.

Inverters 74 and 76 are in series with each other at the feedback signal 16 output of the logic circuit 6. The inverters 74 and 76 serve to buffer the feedback signal 16 coming from the flip flop 69 to avoid or reduce degradation of the feedback signal 16 that might otherwise arise due to it being delivered to a capacitor, namely capacitor C2, in particular since the feedback signal 16 is also used internally in the logic circuit to feed into the NAND gate 70 as part of generating the output signal 18.

Figure 5:
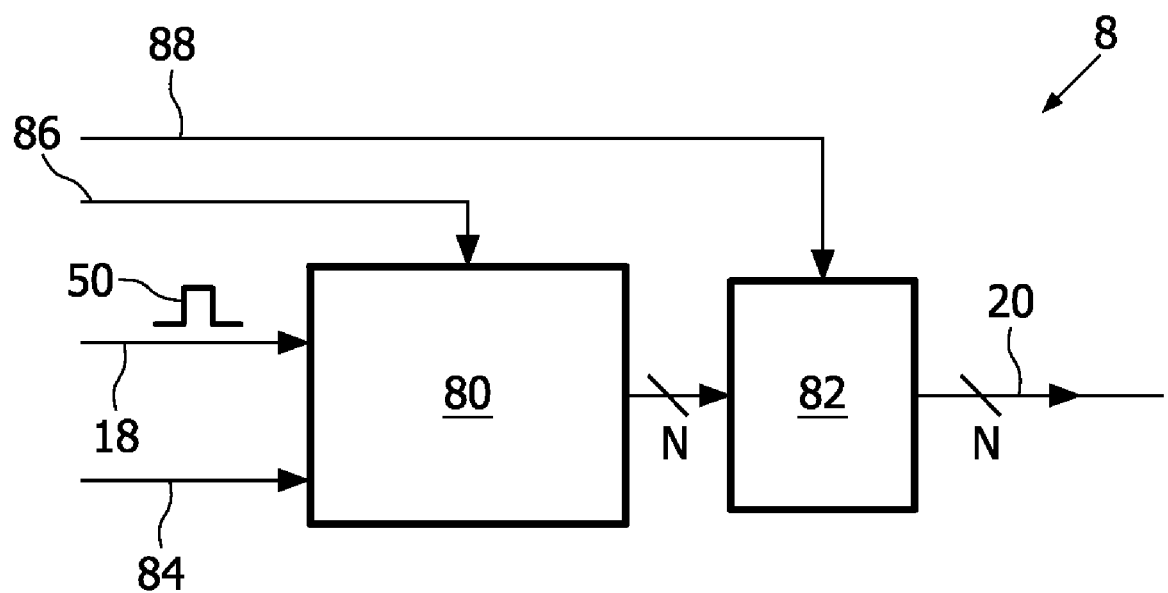
FIG. 5 is a circuit diagram showing further details of a counter circuit which is part of the current measurement circuit of FIG. 1.

In this embodiment the output pulse 50, more particularly the pulse width $T_{OUT}$, is converted into a digital number. In this embodiment this is implemented by the previously described counter circuit 8. FIG. 5 is a circuit diagram showing further details of the counter circuit 8. The counter circuit 8 comprises a counter 80 and a latch 82. The counter 80 is reset at the start of the measurement by a reset signal 86. The output signal 18 from the logic circuit 6 is applied to the counter 80. A reference clock signal 84 is also applied to the counter 80. The output pulse 50 contained in the output signal 18 is used to enable the counter 80. The period of the reference clock signal 84 determines the minimum change in the pulse width $T_{OUT}$ that can be resolved. The counter 80 is incremented during the output pulse 50 so that at the end of the measurement the state of the counter 80 represents the number of reference clock periods within the period of the pulse width $T_{OUT}$. The state of the counter (indicated as N in FIG. 5) is then transferred into the latch 82 where it can be stored until required. Thereafter, under control of a latch signal 88, the state of the counter (indicated as N in FIG. 5) is output from the latch 82 as the previously described digital output data 20.

It will be appreciated that the above described embodiment is merely one example of a way in which the present invention can be implemented, and that many other embodiments are possible.

For example, in other embodiments hysteresis is provided between the comparator circuit 4 and the flip flop 69. This can be done to avoid that the circuit may go into oscillation at the point where the comparator circuit switches. Finite resistance of the power supply lines to the circuit may cause the power supply voltages to drop as the output signal is switched. This change in voltage may be coupled back to the input of the comparator circuit causing it to oscillate. The hysteresis makes the circuit more tolerant of noise on the power supply lines.

As another example, the transistor T2 can be omitted from the capacitor circuit 2. Also, the inverters 72, 74 and 76 may be omitted from the logic circuit 6.

As another example, the sensitivity of the current measurement circuit 1 can be modified by changing the amplitude of the feedback signal 16 or the value of the capacitor C2. This is equivalent to changing the value of (VDD−VSS) or C2 in the above equation relating the current value I to the output pulse width $T_{OUT}$. It may be useful to do this if a wide range of current values are desired to be measured as it avoids the tendency for the pulse width $T_{OUT}$ to become too short or too long.

Figure 6:
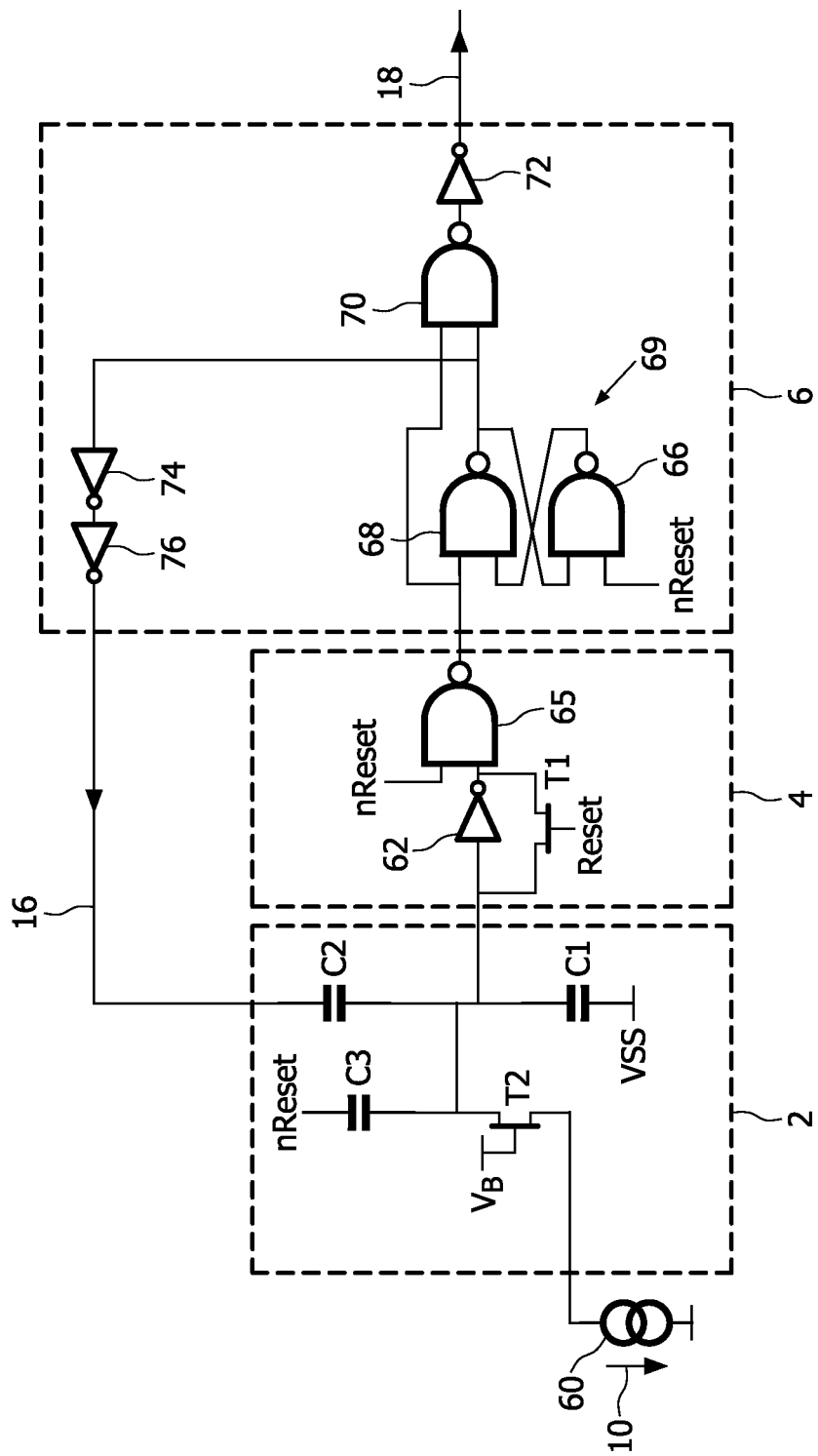
FIG. 6 is a circuit diagram showing details of certain elements of a further current measurement circuit.

Another example will now be described with reference to FIG. 6. FIG. 6 is a circuit diagram showing details of the capacitor circuit 2, the comparator circuit 4 and the logic circuit 6 of a current measurement circuit of a further embodiment. The embodiment shown in FIG. 6 comprises the same elements as are present in the embodiment described earlier with reference to FIG. 4, except where described below, and corresponding elements are labeled with the same reference numerals. The arrangement in FIG. 6 is the same as that of FIG. 4, except that:

(i) the transistor T1 is positioned across the CMOS inverter 62 in the comparator circuit 4 instead of in the capacitor circuit 2;

(ii) in the capacitor circuit 2, a further capacitor C3 is positioned where T1 was positioned in the FIG. 4 embodiment; and (ii) in the comparator circuit 4, the second CMOS inverter 64 is replaced by a NAND gate 65.

In this embodiment the voltage is reset at the input of the comparator circuit 4 to a value which is close to the threshold voltage $V_{threshold}$ of the comparator circuit 4 as this reduces the delay before the first time that the comparator switches. This is achieved by connecting transistor T1 between the input and the output of the first CMOS inverter 62 in the comparator circuit 4. The gate of transistor T1 is driven with the signal Reset as in the FIG. 4 embodiment. During the reset period the input and output of the first CMOS inverter 62 are connected together and the comparator input voltage becomes equal to the threshold voltage of the inverter. At the end of the reset period the comparator input voltage is made to go slightly above the threshold voltage. This is achieved by the capacitor C3 connected between the input of the comparator and the signal nReset. From this point onward the behavior of the circuit of FIG. 6 is the same as that of the circuit described above with reference to FIG. 4.

More generally, other capacitor circuits can be employed instead of the above described one, to provide a function of charge integrating of the current to be measured, and in opposition thereto, charge integrating a feedback signal, the feedback signal and the current to be measured charging/integrating in an opposing or competitive sense so that the combined effect provides a measure of the strength of the current to be measured. For example, in other embodiments capacitor C1 (and hence VSS) may be omitted, with the capacitor circuit merely comprising the single capacitor C2. Indeed, in other embodiments, a suitable integrating circuit carrying out integrating without actual use of capacitors may be employed instead of a capacitor-based circuit as such.

In similar fashion, other comparator circuits may be employed instead of the particular comparator circuit described above. Such other comparator circuits should preferably have a comparator threshold that need not be specified in an absolute sense, rather repetition in terms of the feedback cycle being more desirable.

Other logic circuits may be employed instead of the particular logic circuit described above. Moreover, in logic circuits based on the above described one, or indeed other logic circuits, the information provided by the various switching stages of the waveforms, in particular that of the comparator output voltage, may be employed to give an indication or representation of the current level in ways other than the one described above in which the time between the second and third switchings or transitions of the comparator output voltage is used to initiate and terminate a pulse width. For example, other timings may be used to define a pulse. As another example, the time between such switchings may instead be detected or monitored in some other way rather than defining a pulse, for example by altering a reference frequency or in some other manner.

Furthermore, even when a pulse width is used as in the above described embodiment, this need not be converted into a digital value in the manner described above. Other circuits or ways of converting the pulse width into a digital signal may be employed. Indeed, the pulse width or other parameter/output may be used, e.g. as an input in an automatic process, without the need to ever convert it to a digital indication as such. Generally the present invention can be applied to current measurements where a simple circuit which is tolerant of variations in transistor characteristics is required or desirable. Sensor applications using large area electronics technology are one such area. One example is integration of light sensors onto the substrate of an active matrix display. A thin film transistor or thin film diode detects the light and passes a current which depends on the intensity of the light. The magnitude of this current signal can be very small making it susceptible to electrical noise from the signals applied to the display or circuits within the display module. The above described current measurement circuit and method, including different embodiments thereof, can be used to convert the current from the transistor or the diode into a digital signal which is relatively insensitive to noise.

The invention claimed is:

1. Apparatus for measuring a current, comprising:
   a charge integrating circuit;
   a comparator circuit; and
   a logic circuit; wherein
   the charge integrating circuit is arranged to integrate charge from the current to be measured and apply a resulting change in voltage as an input to the comparator circuit;
   the comparator circuit is arranged to compare the input voltage with a threshold voltage level and provide an output responsive thereto to the logic circuit;
   the logic circuit is arranged to generate a feedback signal dependent upon the comparator output and to provide the feedback signal to the charge integrating circuit;
   the charge integrating circuit is further arranged to integrate charge from the received feedback signal in opposition to the integrating of the charge from the current to be measured;
   the logic circuit is further arranged to generate an output signal based upon the output from the comparator circuit and dependent upon the level of the current to be measured;
   the current to be measured removes charges from the charge integrating circuit, and the feedback signal adds charges to the charge integrating circuit;
   the amount of charge added to the charge integrating circuit by the feedback signal is a known amount; and
   the input voltage of the comparator circuit increases above the threshold voltage level when the feedback signal adds charges to the charge integrating circuit, and the output signal generated by the logic circuit comprises a pulse having a width dependent upon the time duration for the current to be measured to remove at least a portion of the known amount of charge added to the charge integrating circuit to reduce the input voltage of the comparator circuit to the threshold voltage level.

2. Apparatus according to claim 1, wherein the output signal generated by the logic circuit comprises a pulse of a width dependent upon the level of the current to be measured.

3. Apparatus according to claim 1, wherein the apparatus further comprises a converter circuit arranged to convert the output signal to digital output data.

4. Apparatus according to claim 1, wherein the comparator circuit comprises an inverter, the threshold voltage level being the switching threshold voltage of the inverter.

5. Apparatus according to claim 1, wherein the charge integrating circuit comprises a transistor arranged to isolate the input of the comparator circuit from the current to be measured input of the charge integrating circuit.

6. A method for measuring a current, comprising:
a charge integrating circuit integrating charge from the current to be measured and applying a resulting change in voltage as an input to a comparator circuit;
the comparator circuit comparing the input voltage with a threshold voltage level and providing an output responsive thereto to a logic circuit;
the logic circuit generating a feedback signal dependent upon the comparator output and providing the feedback signal to the charge integrating circuit;
the charge integrating circuit integrating charge from the received feedback signal in opposition to the integrating of the charge from the current to be measured; and
the logic circuit generating an output signal based upon the output from the comparator circuit and dependent upon the level of the current to be measured;
the current to be measured removing charges from the charge integrating circuit, and the feedback signal adding charges to the charge integrating circuit;
the amount of charge added to the charge integrating circuit by the feedback signal is a known amount; and
the input voltage of the comparator circuit increasing above the threshold voltage level when the feedback signal adds charges to the charge integrating circuit, and the output signal generated by the logic circuit comprising a pulse having a width dependent upon the time duration for the current to be measured to remove at least a portion of the known amount of charge added to the charge integrating circuit to reduce the input voltage of the comparator circuit to the threshold voltage level.

7. A method according to claim 6, wherein the output signal generated by the logic circuit comprises a pulse of a width dependent upon the level of the current to be measured.

8. A method according to claim 6, further comprising a converter circuit converting the output signal to digital output data.

9. A method according to claim 6, wherein the comparator circuit comprises an inverter, the threshold voltage level being the switching threshold voltage of the inverter.

10. A method according to claim 6, wherein the charge integrating circuit comprises a transistor arranged to isolate the input of the comparator circuit from the current to be measured input of the charge integrating circuit.

11. An active matrix device comprising
an apparatus for measuring a current, comprising:
a charge integrating circuit;
a comparator circuit; and
a logic circuit; wherein
the charge integrating circuit is arranged to integrate charge from the current to be measured and apply a resulting change in voltage as an input to the comparator circuit;
the comparator circuit is arranged to compare the input voltage with a threshold voltage level and provide an output responsive thereto to the logic circuit;
the logic circuit is arranged to generate a feedback signal dependent upon the comparator output and to provide the feedback signal to the charge integrating circuit;
the charge integrating circuit is further arranged to integrate charge from the received feedback signal in opposition to the integrating of the charge from the current to be measured;
the logic circuit is further arranged to generate an output signal based upon the output from the comparator circuit and dependent upon the level of the current to be measured; and
the comparator circuit comprises at least one thin film component formed on a substrate of the active matrix device.

12. The active matrix device of claim 11 in which the output signal generated by the logic circuit comprises a pulse of a width dependent upon the level of the current to be measured.

13. The active matrix device of claim 11 in which the apparatus further comprises a converter circuit arranged to convert the output signal to digital output data.

14. The active matrix device of claim 11 in which the comparator circuit comprises an inverter, the threshold voltage level being the switching threshold voltage of the inverter.

15. The active matrix device of claim 11 in which the charge integrating circuit comprises a transistor arranged to isolate the input of the comparator circuit from the current to be measured input of the charge integrating circuit.

16. The active matrix device of claim 11 in which the current to be measured removes charges from the charge integrating circuit, and the feedback signal adds charges to the charge integrating circuit.

17. The active matrix device of claim 16 in which the amount of charge added to the charge integrating circuit by the feedback signal is independent of characteristics of the at least one thin film component of the comparator circuit.

* * * * *

UNITED STATES PATENT AND TRADEMARK OFFICE
CERTIFICATE OF CORRECTION

PATENT NO. : 7,952,343 B2  Page 1 of 1
APPLICATION NO. : 12/097433
DATED : May 31, 2011
INVENTOR(S) : Martin J. Edwards It is certified that error appears in the above-identified patent and that said Letters Patent is hereby corrected as shown below:

Title page, col. 2, under (57) ABSTRACT, line 6, delete "(Vthreshoid)" and insert --(Vthreshold)--.

Signed and Sealed this
Twentieth Day of September, 2011

David J. Kappos
*Director of the United States Patent and Trademark Office*